United States Patent [19]
Dingle et al.

[11] 3,982,207
[45] Sept. 21, 1976

[54] QUANTUM EFFECTS IN HETEROSTRUCTURE LASERS

[75] Inventors: Raymond Dingle, Summit; Charles Howard Henry, New Providence, both of N.J.

[73] Assignee: Bell Telephone Laboratories, Incorporated, Murray Hill, N.J.

[22] Filed: Mar. 7, 1975

[21] Appl. No.: 556,305

[52] U.S. Cl. ............................ 331/94.5 H; 357/16; 357/18
[51] Int. Cl.² ........................................ H01S 3/00
[58] Field of Search ............. 331/94.5 H; 357/16, 357/18

[56] References Cited
UNITED STATES PATENTS

| | | | |
|---|---|---|---|
| 3,691,476 | 9/1972 | Hayashi | 331/94.5 H |
| 3,911,376 | 10/1975 | Thompson | 331/94.5 H |

OTHER PUBLICATIONS

"Quantum States of Confined Carriers, Etc.," R. Dingle et al., Physical Review Letters, vol. 33, No. 14, 9-30-74, pp. 827-830.

"$Ga_{1-x}Al_xA_s$ Superlattices Profiled, etc.," R. Ludeke et al., Applied Physics Letters, vol. 24, No. 9, 5-1-74, pp. 417-419.

*Primary Examiner*—Eugene La Roche
*Attorney, Agent, or Firm*—M. J. Urbano

[57] ABSTRACT

Described is a heterostructure semiconductor laser comprising a pair of wide bandgap layers having an active region sandwiched therebetween characterized in that the active region includes a plurality of thin narrow bandgap active layers interleaved with a plurality of thin relatively wider bandgap passive layers. The passive layers are thin enough (e.g., about 10–500 Angstroms) to permit electrons to distribute among the active layers either by tunneling through, or by hopping over, the energy barriers created by the passive layers. The active layers are thin enough (e.g., about 10–500 Angstroms) to separate the quantum levels of electrons confined therein. These lasers exhibit wavelength tunability by changing the thickness of the active layers. Also described is the possibility of threshold reductions resulting from modification of the density of electron states.

10 Claims, 9 Drawing Figures

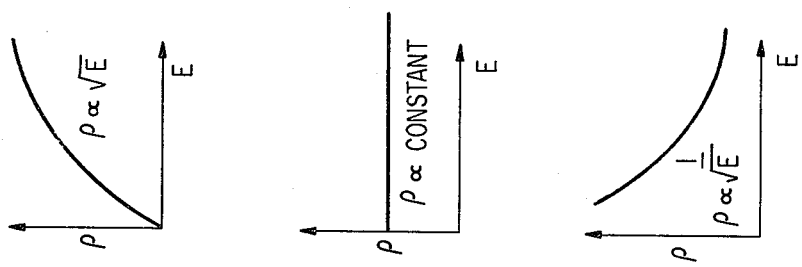
FIG. 5A  $\rho \propto \sqrt{E}$
FIG. 5B  $\rho \propto$ CONSTANT
FIG. 5C  $\rho \propto \dfrac{1}{\sqrt{E}}$
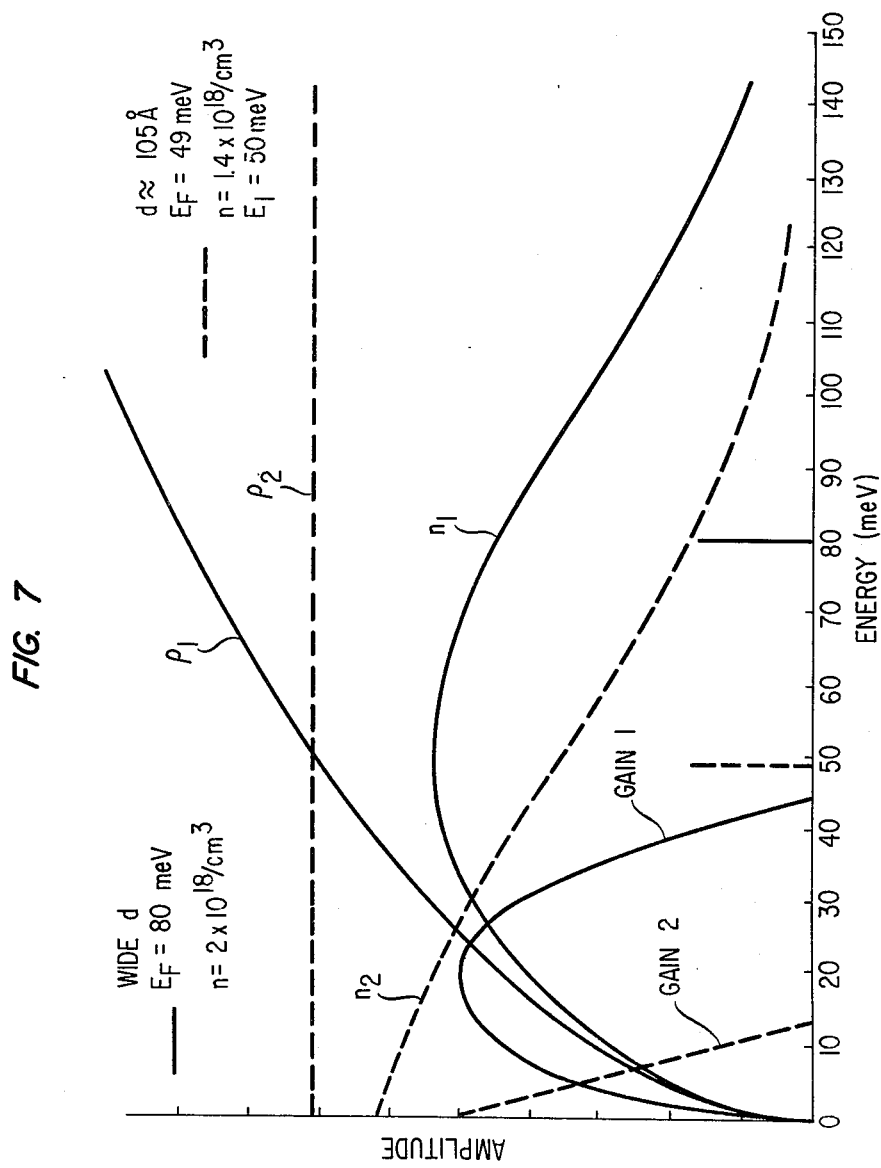
FIG. 7

QUANTUM EFFECTS IN HETEROSTRUCTURE LASERS

BACKGROUND OF THE INVENTION

This invention relates to semiconductor lasers and, more particularly, to quantum effects in heterostructure lasers.

A conventional double heterostructure (DH) junction laser is generally fabricated from the GaAs-AlGaAs materials system and includes a pair of wide bandgap layers (e.g., AlGaAs) of opposite conductivity type and an active region (e.g., GaAs) sandwiched therebetween. The interfaces between th active region and the wide bandgap layers form a pair of heterojunctions which provide both optical and carrier confinement. For C.W. operation at room temperature the thickness of the active region is between about $\lambda/2$ and 1.0 $\mu$m, where $\lambda$ is the wavelength of the laser radiation as measured in the semiconductor. In practice, it has been found that this thickness is preferably between about 0.2 and 0.5 $\mu$m for GaAs-AlGaAs DH lasers.

The lasing threshold of conventional DH lasers is a function of the thickness of the active region. As this thickness decreases so does the threshold until at some point, about $\lambda/2$, the waveguide formed by the heterojunctions fails to provide adequate optical confinement. Thereafter, the threshold begins to increase.

On the other hand, the wavelength of radiation generated by conventional DH lasers is determined by the bandgap of the active region. That is, radiative recombination of electrons in the conduction band with holes in the valence band produces the laser light. It is known that the wavelength of the radiation can be changed by altering the composition of the active region. Thus, a p-type GaAs active region produces radiation at about 0.9 $\mu$m. When aluminum is added to the active region, the wavelength shifts to as low as 0.77 $\mu$m.

From the standpoint of quantum effects, because the active region of conventional DH lasers is thicker than 500 Angstroms (typically 2000 to 5000 Angstroms as discussed above), the discrete energy levels associated with confined electrons are so closely spaced that quantum effects are negligible.

SUMMARY OF THE INVENTION

Our invention, however, exploits quantum effects in heterostructure semiconductor lasers to produce wavelength tunability without having to rely on changes of the composition of the active region. These quantum effects may also give rise to lower lasing thresholds.

In accordance with an illustrative embodiment of our invention, a multilayered semiconductor body for use in a heterostructure laser comprises a pair of wide bandgap layers and an active region sandwiched therebetween characterized in that the active region includes a plurality of thin narrow bandgap active layers interleaved with a plurality of thin relatively wider bandgap passive layers. The passive layers are thin enough (less than about 500 Angstroms) to permit carriers to distribute themselves among the active layers when the body is pumped (either optically via another laser or electrically via a forward biased p-n junction). The distribution of carriers occurs either by tunneling through, or by hopping over, the energy barriers created by the passive layers. The active layers are thin enough (also less than about 500 Angstroms) to separate the discrete energy levels of confined carriers. When suitably pumped, lasing occurs generally between the lowest bound electron state and a bound hole state. The energy of the laser radiation is greater than the bandgap of the bulk material of the active layer and can be tuned by changing the thickness of the active layers.

These same quantum effects modify the density of electron states and, as discussed more fully hereinafter, suggest that out invention may have lower laser thresholds than conventional DH lasers. In order to take full advantage of this effect, the thickness of the active layers is preferably about 50 Angstroms.

BRIEF DESCRIPTION OF THE DRAWING

Our invention, together with its various features and advantages, can be readily understood from the following more detailed description taken in conjunction with the accompanying drawing, in which:

FIGS. 5A, 5B and 5C show the density of states versus energy for a non-interacting electron gas with three, two and one degrees of freedom, respectively;

FIG. 7 shows the gain and electron distribution versus energy for the center layer of a double heterostructure.

DETAILED DESCRIPTION

Figure 1:
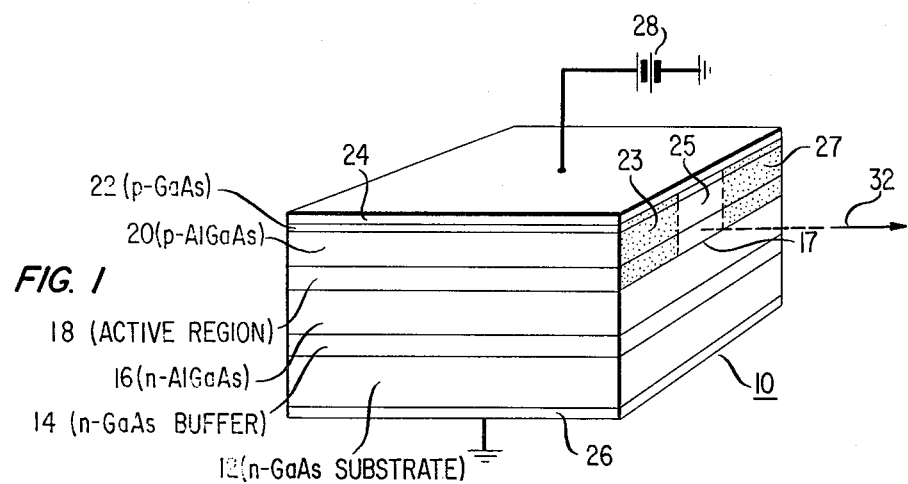
FIG. 1 is a schematic pictorial view of a heterostructure laser in accordance with an illustrative embodiment of our invention.

Turning now to FIG. 1, there is shown an illustrative embodiment of our invention, a heterostructure semiconductor laser 10 comprising a multilayered body fabricated preferably by molecular beam epitaxy (MBE) techniques. The body includes a substrate 12 on which are grown the following layers in the order recited: an optical buffer layer 14 generally of the same composition and conductivity type as the substrate; a first wide bandgap layer 16; an active region 18; a second wide bandgap layer 20 having a conductivity type opposite to that of layer 16; and an optional contacting layer 22. Electrical contacts 24 and 26 are formed on layer 22 and substrate 12, respectively.

The body may be pumped either optically via a laser (not shown) or electrically via a forward biased p-n junction. With optical pumping, wide bandgap layers 16 and 20 need not have opposite conductivity types, contacts 24 and 26 and layer 22 would be omitted, and the pumping laser radiation would have an energy greater than the bandgap of the active region 18. With electrical pumping, a battery 28 is connected in forward bias across contacts 24 and 26 to supply current in excess of the lasing threshold. In this case, current is preferably confined to a central core 25 by proton bombarding the lateral zones 23 and 27 along the length of the laser and to a depth of at least heterojunction 17 between layers 16 and 18. Thus contact 24 would function as a well known stripe of geometry contact.

Figure 2:
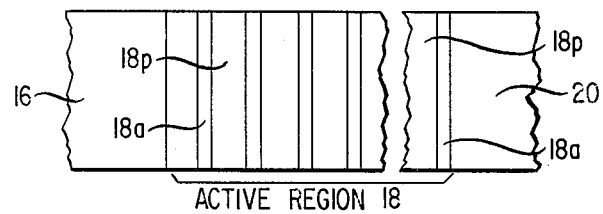
FIG. 2 shows the layered structure of the active region of FIG. 1.

As shown in FIG. 2, our invention is characterized in that active region 18 comprises a plurality of thin narrow bandgap active layers 18a interleaved with a plurality of thin relatively wider bandgap passive layers 18p. Generally, layers 18a and 18p are of the same conductivity type. Layers 18a are active in that radiative recombination of holes and electrons occurs therein to generate radiation characteristic of quantum effects of our laser. Layers 18p, in contrast, are passive in that such radiative recombination does not take place therein.

Figure 3:
FIG. 3 shows the energy levels of the active region of FIG. 2.

Important to the exploitation of quantum effects in our laser is the thickness of the active and passive layers of active region 18. In particular, passive layers 18p should be thin enough (less than about 500 Angstroms) to permit carriers to distribute themselves among the active layers when the body is pumped above the lasing threshold. The distribution of carriers occurs either by tunneling through, or by hopping over, the energy barriers 30 (FIG. 3) created by the wider bandgap passive layers 18p. The active layers 18a, on the other hand, are thin enough (less than 500 Angstroms) to separate the discrete energy levels (i.e., bound states, FIG. 4) of carriers confined to the active layers 18a. Under such circumstances lasing occurs in the active layers at an energy hv between the lowest energy bound state ($n = 1$) of electrons and bound hole states. As will be discussed in detail hereinafter, decreasing the thickness of the active layers increases the separation between the bound states and increases the energy of the lowest bound state, thereby increasing hv.

Before discussing the theory of operation of our invention, it will be instructive to consider illustrative embodiments fabricated from the GaAs-AlGaAs materials system. Thus, on an n-GaAs substrate 12 would be epitaxially grown n-GaAs buffer layer 14, n-$Al_xGa_{1-x}As$ first wide bandgap layer 16, active region 18, $Al_yGa_{1-y}As$ layer 20 (p-type if electrically pumped) and $p^+$-GaAs layer 22 which facilitates electrical contacting. For a symmetrical waveguide the mole fraction of AlAs in layers 16 and 20 is made the same (i.e., $x = y$).

Growing the active region entails growing first a passive layer of $Al_zGa_{1-z}As$ ($z$  $x$) on n-$Al_xGa_{1-x}As$ layer 16 and then growing an active layer of $Al_rGa_{1-r}As$ (O  r < z). This process is repeated until the desired number of active and passive layers is attained. When utilizing electrical pumping, the active and passive layers would have the same conductivity type as $Al_yGa_{1-y}As$ passive layer 20.

In the following example which utilized optical pumping, the layers were grown by MBE on an (001) oriented n-GaAs substrate 12. Buffer layer 14 was 2 $\mu$m thick n-GaAs and first wide bandgap layer 16 was 2 $\mu$m thick $Al_{0.2}Ga_{0.8}As$. The active region 18 included fifty GaAs active layers each 80 Angstroms thick and fifty $Al_{0.2}Ga_{0.8}$ As layers 240 Angstroms thick. The second wide bandgap layer 20 was 2 $\mu$m thick $Al_{0.2}Ga_{0.8}As$. Contacting layer 22, contacts 24 and 26, and proton bombardment of zones 23 and 27 were, of course, omitted.

The laser cavities were 0.75-1.5 mm long with end reflectors formed by cleaved (110) faces. The samples were cooled to about 15° K. For optical pumping tunable radiation from an optical parametric oscillator was focused by a cylindrical lens to a strip about 60 $\mu$m wide on the (001) face of layer 20.

When pumped about 50 percent above its threshold, the active region 18 lased at an energy of 1.536eV which is about 10 meV lower in energy than the $n=1$ bound state (exciton line) of the active region as determined by optical absorption measurements. Incidentally, because the pumping radiation penetrated beyond the active region, oscillation from n-GaAs buffer layer 14 was also observed at 1.509eV which is 6 meV below the 1.515eV energy of the intrinsic exciton. The n-GaAs substrate 12 was heavily doped ($\sim 5 \times 10^{18}/cm^3$) and showed negligible luminescence.

The following additional tests on this sample confirmed that laser oscillation of the active region had been observed: (1) in the region of threshold the light power from the active region and the buffer layer developed a characteristic spiking behavior when excited with a fluctuating pump intensity; (2) the measured linewidth at threshold was limited by the ~1 meV resolution of the spectrometer, and in some cases broadened to as much as ~9 meV at the highest pump power, a width which is characteristic of semiconductor lasers well above threshold; (3) the active region intensity was polarized in the plane of the layers thus indicating heavy holes were involved in the recombination process. The buffer layer emission was not polarized; (4) by translating the magnified image of the output face of the crystal across spectrometer slits, we found that the active region emission originated closer to the front surface than the buffer layer emission and had qualitatively the correct spacing; (5) a variation of the pump energy from 1.65 to 1.75 eV changed only the scattered wavelength, but did not affect the oscillation wavelengths; (6) a separate structure comprising a thick MBE grown GaAs layer with $Al_{0.2}Ga_{0.8}As$ cladding layers on both sides showed only the 1.509 eV emission.

The dependence of the peak output power as a function of optical pump power from an 0.76 mm long laser in accordance with one embodiment of the invention was also measured. In the active region the relative laser output power increased monotonically from about $3 \times 10^{-5}$ to $2 \times 10^{-1}$ as the relative pump power increased from about 0.55 to 1.0. Similarly, in the buffer layer the relative laser output power increased monotonically from about $4 \times 10^{-5}$ to $2 \times 10^0$ as the relative pump power increased from about 0.1 to 1.0. The pump intensity was varied by means of a Glan-Thompson prism polarizer, and the peak pump power at 0.74 $\mu$m just inside the sample was 200 kW/cm² with a pulse length of $10^{-7}$ sec. For total absorption this is equivalent to a current of 120 kA/cm². For the active region thickness the pump intensity was approximately equally absorbed by the active region and the buffer layer and the equivalent thresholds were 36 and 15 kA/cm², respectively. When plotted on a linear scale the emission intensities below and above threshold are linear functions of pump power with the slope of the stimulated emission region being significantly larger than that of the spontaneous emission. The threshold appeared to be highly dependent on the quality of the layers of the active region. For some samples the threshold for the active region was less than the buffer layer threshold.

Theory

The theory of our invention will now be described in order to facilitate understanding the mechanisms by which wavelength tunability and lower lasing thresholds are predicted.

Figure 4:
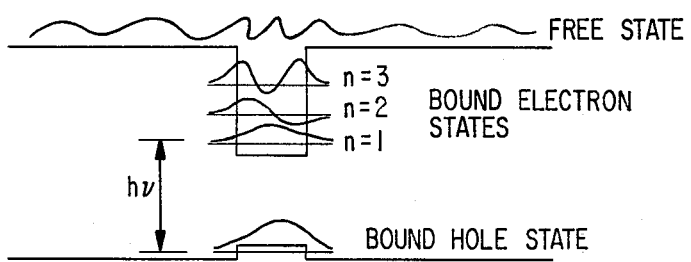
FIG. 4 is a schematic representation of the bound states of electrons and holes confined to a layer thin enough to produce significant quantum effects.

Wavelength tunability can be accurately predicted and such predictions have been completely verified by measurements of the optical absorption edge of GaAs layers (slabs) with different widths, down to values as small as 40 Angstroms. (See, R. Dingle et al, *Physics Review Letters*, Vol. 33, p 827, Sept. 30, 1974 for slabs as thin as 70 Angstroms). The GaAs layers were sandwiched between AlGaAs layers to form heterostructures and were fabricated by molecular beam epitaxy. The wavelength tunability can be estimated as follows. If the electrons were completely confined to the slab, the energy of the lowest conduction band state would change from $E_c$, the conduction band edge energy, to $E_c + E_1$. For an infinite well $E_1$ is given by $$E_1 = \frac{h^2}{8md^2} = \frac{55 \text{ meV}}{\left(\frac{d}{100}\right)^2} \quad (1)$$

and $m^*$ is the effective electron mass of GaAs and $d$ is measured in Angstrom units. For a finite well $E_1$ is given by R. Dingle et al, supra. FIG. 4 shows the bound electron states of the slab. The depth of the potential well is approximatey equal to the difference in the energy gaps between the GaAs central layer and the surrounding AlGaAs layers. Since the potential is finite, the electrons will not be completely confined to the slab, and thus $E_1$ is slightly over estimated by Eq. (1). The laser energy should increase by $E_1$. Assume for a large $d$ laser, the lasing energy is 1.43 eV (8670 Angstroms) with $E_1 = O$. According to Eq. (1), the laser energy and wavelength, for various values of $d$, are as follows:

TABLE I

| d | $E_1$ | E | λ |
|---|---|---|---|
| 500 A | 2.2 meV | 1.432 eV | 8654 A |
| 200 A | 13.8 meV | 1.444 eV | 8583 A |
| 100 A | 55.0 meV | 1.535 eV | 8074 A |
| 50 A | 220.0 meV | 1.650 eV | 7512 A |

To see how the density of electron states is modified by quantum effects we first consider the simplified case of non-interacting electrons in the conduction band. We will see that for values of d 200 Angstroms the electrons will be "frozen into" the lowest bound state at room temperature. Electrons in this state have only two degrees of translational freedom (instead of three). FIGS. 5A, 5B and 5C show the density of states versus energy for a non-interacting electron gas with three, two and one degrees of freedom, respectively. As the number of degrees of freedom is reduced the density of states decreases at high energies. This causes the electrons to occupy the lower energy states and thereby to contribute more effectively to population invention and laser gain. We will then argue that this enhancement in gain, due to a modification of the electron density of states, should still exist in the case of a real laser where interactions of the carriers can not be neglected.

Consider the states of non-interacting electrons confined in the $x$-direction to a slab of width $d$. The electron energy levels $E_n$ will be given by $$E_n = E_c + n^2 E_1 + \frac{h^2}{8\pi^2 m}(K_y^2 + K_z^2) \quad (2)$$

Figure 6:
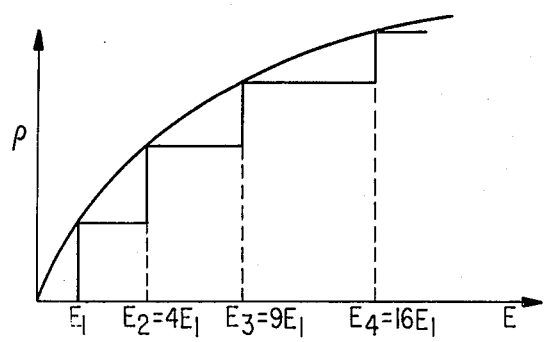
FIG. 6 shows the density of states versus energy of non-interacting electrons confined in one direction to a layer of width $d$.

-continued $$n = 1, 2, \ldots$$

where $E_1$ is given by Eq. (1) and K is the carrier wave vector. The density of states of these electrons, shown in FIG. 6 consists of a series of steps. Each step represents the contribution of electrons in a discrete state $n$. The flat steps reflect the density of states of electrons in a specific quantum state $n$, and have two translational degrees of freedom ($y$ and $z$). The corners of the steps touch the density of states of a three dimensional gas of electrons occupying the same slab, provided that quantum effects are neglected in the three dimensional gas. The density of states $\rho$ of such a three dimensional gas is proportional to E. If $d$ is large, the steps will be closely spaced in energy and the electrons will behave as a three dimensional gas. However, for a sufficiently large separation of the levels (small $d$) the electrons will be frozen into the $n = 1$ state and behave as a two dimensional electron gas. For various values of $d$, $E_2 - E_1$ is given by

TABLE II

| d | $E_2 - E_1 = 3E_1$ |
|---|---|
| 500 A | 6.6 meV |
| 200 A | 41.2 meV |
| 100 A | 165.0 meV |
| 50 A | 660.0 meV |

Slabs less than about 200 Angstroms wide ae sufficient to cause freeze out from $E_2$ to $E_1$ at 300° K.

Let us now compare the luminescence and laser gain for a wide slab ($\rho \alpha$ E) and a narrow slab $d$ 105 Angstrom ($E_1 \approx 50$ meV and $\rho =$ constant $\alpha$ $E_1$). Let $f_n$ and $f_p$ be the Fermi functions which determine the occupancy of the electron and hole states. Light emission is proportional to $f_n f_p$ whereas the absorption is proportional to $(1-f_n)(1-f_p)$. The net laser gain is proportional to the difference $f_n + f_p - 1$. Lasing is known to occur at carrier densities of about $2 \times 10^{18}/\text{cm}^3$. At these densities the hole Fermi level is about 35 meV above the valence band (i.e., in the forbidden gap). Accordingly, for the low energy hole states $f_p \approx 0.2$. If we take $f_p = 0.2$, then only conduction band states with $f_n > 0.8$ contribute to gain. FIG. 7 shows the gain and electron distribution versus energy for the wide slab with $n = 2.0 \times 10^{18}/\text{cm}^3$. For the narrow slab an electron concentration of only $n = 1.4 \times 10^{18}/\text{cm}^3$ is required to achieve the same gain. The dashed curves in FIG. 7 show the gain and electron distribution for this case.

We have neglected the quantum effects associated with confinement of the holes to the slab. Dingle et al, however, have established that holes as well as electrons are confined to the slab. The quantum effects associated with hole confinement are less striking because of the larger hole mass of the heavy hole and the smaller potential well for holes. (The potential well for holes is about 14 percent as deep as the well for electrons in the case of GaAs). We estimate from a rough calculation that these effects will increase the hole Fermi functions $f_p$ by 10–15 percent and this may contribute further to lowering the laser threshold.

We have also neglected the coulomb attraction between the electrons and the holes and other interactions of the carriers. These interactions have two effects. First, the combination of confinement and coulomb attraction between the electron and hole increases the strength of the optical absorption and emission processes and hence the laser gain. It is quite evident from FIG. 2 of Dingle et al that the absorption strength near the lowest exciton has increased. Second, the interactions of carriers with the lattice, with impurities, and with other carriers tend to alter the energies of the band edge transitions. These interactions may be thought of as local variations of the energy gap. They broaden and shift the sharp band edge features of the perfect crystal. Such interactions alter the density of states essentially by producing a distribution of band gap energies. Neither of these two effects should substantially diminish the change in the density of states which results from reducing number of translational degrees of freedom of the carriers. Hence we expect a reduction in laser threshold in the real case as well as in the case of non-interacting carriers.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, the various embodiments of our invention are preferably fabricated from materials systems which are closely lattice matched so as to reduce the number of defects, nonradiative recombination centers and the like, at the interfaces between the layers, especially in the active region. One such system incorporates phosphorus into at least the AlGaAs passive layers, i.e., these layers comprise $Al_xGa_{1-x}As_{1-y}P_y$ whereas the active layers might comprise GaAs, $Al_zGa_{1-z}As$ ($z<x$) or $Al_zGa_{1-z}As_{1-r}P_r$ ($z<x$, $r<y$).

What is claimed is:

1. In a heterostructure laser, a multilayered semiconductor body comprising:
   first and second wide bandgap layers,
   an active region situated between and contiguous with said first and second layers, CHARACTERIZED IN THAT,
   said active region includes a plurality of active layers and a plurality of passive layers interleaved with one another,
   said passive layers having a wider bandgap than said active layers, thereby forming energy barriers between said active layers,
   said passive layers being sufficiently thin to permit carriers to tunnel through or hop over said energy barriers when said body is suitably pumped, and
   said active layers being sufficiently thin to produce quantum effects in said body including separating the discrete energy levels of carriers in said active layers.

2. The body of claim 1 wherein each of said passive and active layers are less than about 500 Angstroms thick.

3. The body of claim 2 wherein said active layers are about 50 Angstroms thick.

4. The body of claim 2 wherein said layers comprise AlGaAs.

5. The body of claim 4 wherein said active layers comprise GaAs and said passive layers comprise $Al_xGa_{1-x}As$, $x > 0$.

6. The body of claim 4 wherein said active layers comprise $Al_xGa_{1-x}As$, $x$ 0 and said passive layers comprise $Al_yGa_{1-y}As_{1-z}P_z$, $y > x$, $z$ 0.

7. The body of claim 2 including means for pumping said body above the lasing threshold.

8. The body of claim 7 wherein said pumping means includes a p-n junction within said body.

9. The body of claim 8 wherein said first and second layers have opposite conductivity types and said active and passive layers have the same conductivity type as one another.

10. The body of claim 9 including means for forward biasing said p-n junction above the lasing threshold.

* * * * *

UNITED STATES PATENT AND TRADEMARK OFFICE
CERTIFICATE OF CORRECTION

PATENT NO. : 3,982,207

DATED : September 21, 1976

INVENTOR(S) : Raymond Dingle and Charles H. Henry

It is certified that error appears in the above—identified patent and that said Letters Patent is hereby corrected as shown below:

In the Background Of The Invention, column 1, line 14, "th" should read --the--. In the Summary Of The Invention, column 2, line 9, "out" should read --our--. In the Detailed Description, column 3, line 26 "hv" should read --h$\nu$--; line 31, "hv" should read --h$\nu$--; line 43, "(z x)" should read --(z $\leq$ x)--; line 44 and line 45, "(O r < z)" should read --(O $\leq$ r $\leq$ z)--. Column 5, line 16, that portion of the equation reading "8md$^2$" should read --8m*d$^2$--; line 16, that portion of the equation reading " d $^2$ " should read -- $\left(\dfrac{d}{100}\right)^2$ --; line 46,"d 200" should read --d $\leq$ 200--; line 56, "invention" should read --inversion--; line 67, that portion of the equation reading "8$\pi^2$m" should read --8$\pi^2$m*--; line 67, that portion of the equation reading "Ky$^2$" should read --K$_y^2$--. Column 6, line 16,"E" should read --$\sqrt{E}$--; line 31, "ae" should read --are--; line 34,"($\rho$ $\alpha$ E)" should read --($\rho$ $\alpha$ $\sqrt{E}$ )--; line 34, "d 105" should read --d $\sim$ 105--; line 35, "$\alpha$ E$_1$" should read --$\alpha$ $\sqrt{E_1}$--. Column 8, line 28, that portion of the formula reading "x O" should read --x $\geq$ O--; line 29, that portion of the formula reading "z O" should read --z $\geq$ O--.

Signed and Sealed this

Twenty-fourth Day of August 1982

|SEAL|

Attest:

GERALD J. MOSSINGHOFF

Attesting Officer    Commissioner of Patents and Trademarks